US006903028B2

(12) United States Patent
Young

(10) Patent No.: US 6,903,028 B2
(45) Date of Patent: Jun. 7, 2005

(54) SOFT-LANDING ETCHING METHOD USING DOPING LEVEL CONTROL

(75) Inventor: Jung Woo Young, Malaysia (KR)

(73) Assignee: 1st Silicon (malaysia) Sdn Bhd (MY)

( * ) Notice: Subject to any disclaimer, the term of this patent is extended or adjusted under 35 U.S.C. 154(b) by 22 days.

(21) Appl. No.: 10/306,962

(22) Filed: Nov. 29, 2002

(65) Prior Publication Data

US 2004/0106300 A1 Jun. 3, 2004

(51) Int. Cl.[7] .............................................. H01L 21/31
(52) U.S. Cl. .................... 438/758; 438/241; 257/758; 216/67; 216/37
(58) Field of Search ................... 438/758, 760, 438/241; 257/758; 216/67; 276/37

(56) References Cited

U.S. PATENT DOCUMENTS

| | | | |
|---|---|---|---|
| 5,329,152 A | * 7/1994 | Janai et al. | 257/529 |
| 5,948,703 A | 9/1999 | Shen et al. | |
| 6,136,211 A | * 10/2000 | Qian et al. | 216/37 |
| 6,472,266 B1 | * 10/2002 | Yu et al. | 438/241 |
| 6,614,119 B1 | * 9/2003 | Asahina et al. | 257/758 |
| 6,699,399 B1 | * 3/2004 | Qian et al. | 216/67 |

* cited by examiner

Primary Examiner—Michael S. Lebentritt
Assistant Examiner—Olivia T Luk
(74) Attorney, Agent, or Firm—Lawrence Y.D. Ho & Assoc.

(57) ABSTRACT

The method of the present invention comprises the steps of: (a) laying on a prior layer, a first oxide layer doped in one form; (b) laying on said first oxide layer, a second oxide layer doped in a different form; (c) patterning said layers; (d) etching the second layer with an etchant having high selectivity to said second doped oxide layer; and (e) etching the first layer with an etchant having high selectivity to said first doped oxide layer.

As the etch rate is higher for the highly doped oxide than that for the lightly doped oxide, high selectivity of etching between such layers can therefore be attained. A lightly doped silicon oxide layer may therefore be used to stop etching at an optimal thickness over the complicated layer of substrate. The lightly doped silicon oxide area may be covered with a layer of highly doped silicon oxide layer which may be etched with a specific etchant.

11 Claims, 2 Drawing Sheets

SOFT-LANDING ETCHING METHOD USING DOPING LEVEL CONTROL

FIELD OF INVENTION

The present invention relates to a process for the manufacture of semiconductor electronic devices and integrated circuits. In particular, it relates to a soft-landing etching method for forming, e.g. a gate oxide layer or contact hole at a desired level.

BACKGROUND ART

In the semiconductor manufacturing processes, it is most difficult to make contact at the specific location and to form good contact holes without damaging the substrate layer during etching process. This is due to the ever-increasing scale of integration of circuits thus demanding that the thickness of oxide gate layers and misalign margin of the contact formation be reduced further. Hence, there is a need for soft-landing etching methods for gate etching and contact hole etching in order to prevent gate oxide damage or field oxide damage during etching process.

Underneath all the layers fabricated upon the semiconductor substrate is the basic structure of and active and/or field oxide areas laid down according to the previous patterning process of semiconductor fabrication. It is a demanding and exacting process in a gate or contact formation to etch the contact hole without or with insignificant field oxide loss on the previous layer.

The soft-landing etching process endeavours to overcome this problem. The prior art technology was to use oxinitride film to prevent gate oxide or field oxide from being over-etched during poly gate etching or contact hole etching process.

In addition to preventing over-etching, the contact area of a contact hole must not be affected by its side wall taper, hence a high degree of anisotropic etching is also required and which is assuaged by, for example, high-density plasma etching techniques so that the side wall oxide or nitride may be protected during the contact hole etching process.

In U.S. Pat. No. 5,948,703 (Shen) the soft-landing gate etching comprises laying specific layers of materials and using a series of 3 different etchants, each being specific to the materials to be etched. This includes forming a polysilicon layer on the oxide layer, forming a layer of conductive material on the polysilicon layer and forming a mask defining the elements of the semiconductor device. The first etching step substantially removes the entire conductive layer through the mask (with a high density plasma) between the elements. The second etching step removes the polysilicon until the oxide layer is exposed between the elements. A third etching step then removes the polysilicon residues from the oxide layer between the elements.

This prior art technique may be especially difficult to apply without using additional layer such as nitride or oxinitride when a contact hole falls on the boundary between an active area and a field oxide. A misalignment or over-etching can cause the loss of the field silicon oxide layer during etching process and this loss of the silicon oxide may cause leakage in the circuit during the operation of the semiconductor device.

OBJECTS OF THE INVENTION

It is thus very critical to minimize undesirable etching of substrate at certain location, depth or layer while allowing etching to sufficiently remove all remaining unwanted residue material. The desirable etching process should therefore exhibit very high selectivity to the underlying layers and at a controllable rate to control up to a required critical dimension to prevent damage to the oxide or active area.

It is hence the object of the present invention to provide a high-selective etching process to achieve a soft-landing etching process using doping level control in the same material layers to form a uniform contact hole regardless of morphology and material of underlying layers without any undesirable loss at the underneath layers. It is also an object to have etching process controllability to stop the etching at a desirable or predetermined layer or depth or height of the silicon oxide layer.

SUMMARY OF THE INVENTION

To achieve these objects, the present invention takes advantage of the different etch rate according to the doping level or type of doping of the silicon oxide layers.

In a broad, general sense the method of the present invention comprises the steps of:

(a) laying on a prior layer, a first oxide layer doped in one form;

(b) laying on said first oxide layer, a second oxide layer doped in a different form;

(c) patterning said layers;

(d) etching the second layer with an etchant having high selectivity to said second doped oxide layer; and (e) etching the first layer with an etchant having high selectivity to said first doped oxide layer.

For example, the etch rate is higher for the highly doped silicon oxide than that for the lightly doped silicon oxide. High selectivity of etching between such layers can therefore be attained. With such high selectivity of etching, it is possible to control etching rate and the amount etched to a very accurate level or terminate the etching in a soft-landing.

A lightly doped silicon oxide layer may therefore be used to stop etching at an optimal thickness over the complicated layer of substrate. The lightly doped silicon oxide area may be covered with a layer of highly doped silicon oxide layer.

To protect the field oxide isolation area, soft-landing etching may be performed using high selectivity etching between the lightly doped silicon oxide and highly doped silicon oxide. The selective etching can protect field area and minimize the loss of the field oxide during etching process.

Apart from the doping level or concentration differential, the method may also be adapted to other doping characteristics such as doping depth, dopant material, etc. as long as the difference in doping may be exploited with different etchants having different specificity to the differently doped layers.

A preferred embodiment of the method of the present invention comprises the steps of:

(a) laying on a prior layer, a non- or lightly-doped oxide layer);

(b) laying on said lightly-doped oxide layer, a highly-doped oxide layer);

(c) patterning said layers;

(d) etching the highly-doped layer with an etchant having high selectivity to said highly-doped oxide layer; and (e) etching the lightly-doped layer with an etchant having high selectivity to said lightly-doped layer.

BRIEF DESCRIPTION OF DRAWINGS

The method of the present invention may now be illustrated with reference to the following drawings as specific embodiments, which are not to be construed as the sole embodiment or delimiting the scope of the invention thereto, wherein—

DETAILED DESCRIPTION OF EMBODIMENTS

The method of the present invention may be described in detail with reference to the accompanying drawings in the following. Although the method may be used in general to fabricate various patterns on a semiconductor wafer, the specific embodiment described in the following concerns patterning a more difficult structure, i.e. a gate or contact hole over a boundary between an active area and a field oxide.

If an isolation structure is proposed to be formed which falls onto both the active area and isolation or field oxide area adjacent each other, e.g. a contact hole falling on the boundary of an active area and isolation area. A slight misalignment may cause the isolation area, which comprised of silicon oxide, be easily etched off during etching process. As a result, the eroded area may become a source of current leakage during the semiconductor device's operation.

Figure 1:
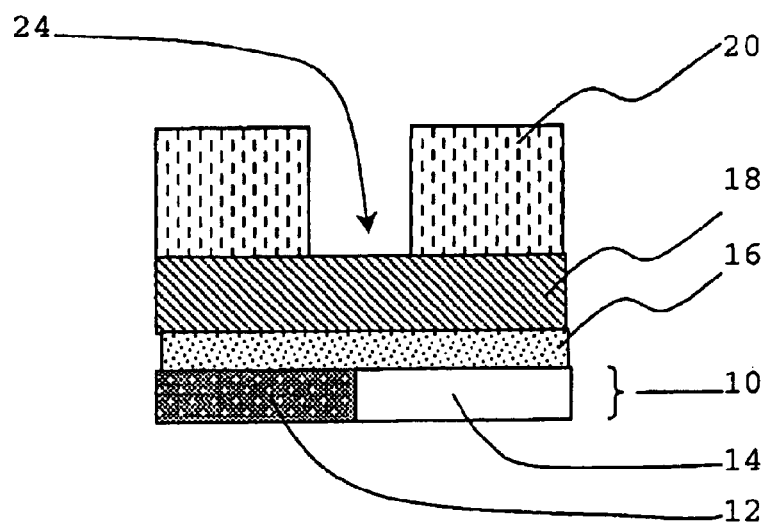
FIG. 1 shows a sample embodiment of a pattern that is formed with a highly doped silicon oxide layer on top of lightly doped silicon oxide on a substrate.

Based on the finding that two differently doped oxide layers may be etched at different rates, soft-landing or controlled etching of the layers may be achieved using the following method with reference to FIG. 1.

In FIG. 1, an underlying or prior layer (10) is shown comprising of an active area (12) and isolation field oxide (14) adjacent one another. A first oxide layer (16) doped in one form is initially laid over the prior layer (10), i.e. over both the active area (12) and isolation field oxide (14). A second oxide layer (18) doped in a different form is then laid over the first oxide layer (16). It will be appreciated that the thickness of each layer may be determined according to the device configuration and etching recipe characteristics.

The differently doped oxide layers may mean that the oxide layers are doped in different characteristics, e.g. each layer having different concentration of dopants, different doping elements or materials used, order of the doped layers laid onto each other, etc. as long as the doping differential may be exploited to etching specificity by the etchants or mixtures of etchants. In the present specific embodiment shown, the first oxide layer (16) is a lightly doped silicon oxide layer and the second oxide layer (18) is a highly doped oxide layer.

Next, the layers are patterned in conventional manner with, e.g. photo-masking, resulting in photoresist (20) being formed over regions to be protected (22) and regions which are to be etched being exposed (24).

Figure 2:
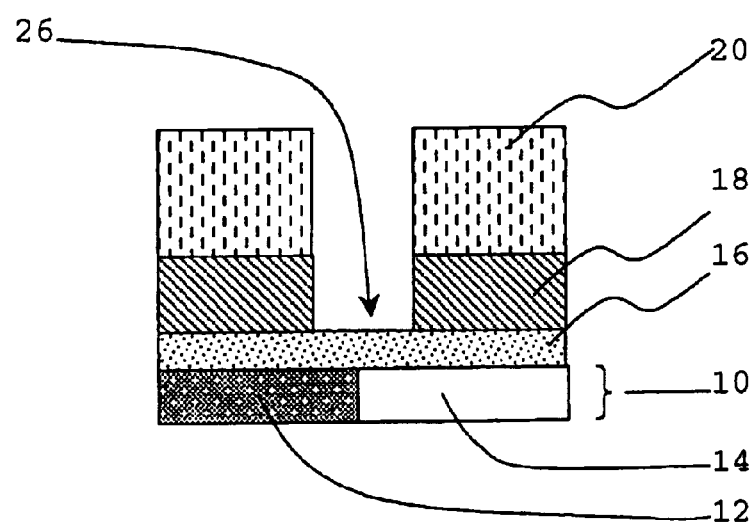
FIG. 2 shows a sample embodiment of a pattern that is formed after soft-landing etching with a recipe according to the present invention. The etching was stopped on the surface of lightly doped silicon oxide.

The subsequent step is to separately and specifically etch each of the second and then the first oxide layers without affecting the respective immediately underlying layers (12, 14). In the present example, as is shown in FIG. 2, the second oxide layer (18), i.e. the highly doped silicon oxide is etched away (26) initially using etchant or mixture of etchants that is highly specific to highly doped oxide in order to leave the underlying lightly doped oxide layer (16) substantially unscathed.

Because of the doping difference between the layers and the specificity of the etchants, the etching process will be retarded or stopped when the etching reaches the lightly doped silicon oxide layer (16).

Figure 3:
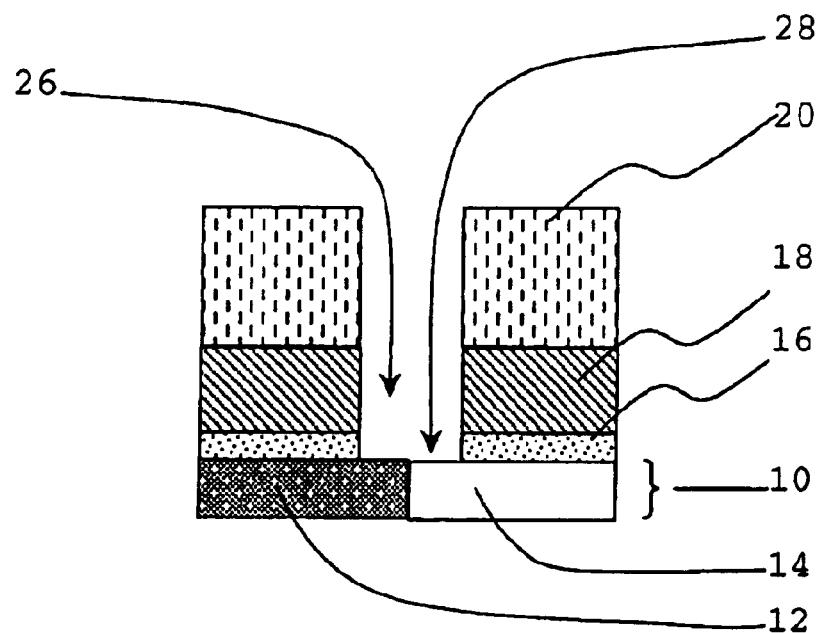
FIG. 3 shows a sample embodiment of a pattern that is formed after soft-landing etching with another recipe according to the present invention. The etching was done to remove lightly doped silicon oxide using different recipe.

Upon the completion of the etching process of the highly doped second layer (18), as shown in FIG. 3, the first layer (16) is then etched (28) using an etchant or combination of etching chemicals having high selectivity to the first oxide layer (16), i.e. in the present example, selective to the lightly doped silicon oxide. The etching process will be retarded or terminated upon reaching the isolation field (14) and active area (12) due to its specificity.

Preferably, the high selectivity of the etchants to lightly doped oxide layer may enable the etching to be carried out for an extended period without over-etching and damaging the prior or underlying layer, i.e. active area and field oxide. In another aspect, an etchant having a low selectivity to the lightly doped layer may also be used to enable the etching to be carried out over an extended period without over-etching.

Figure 4:
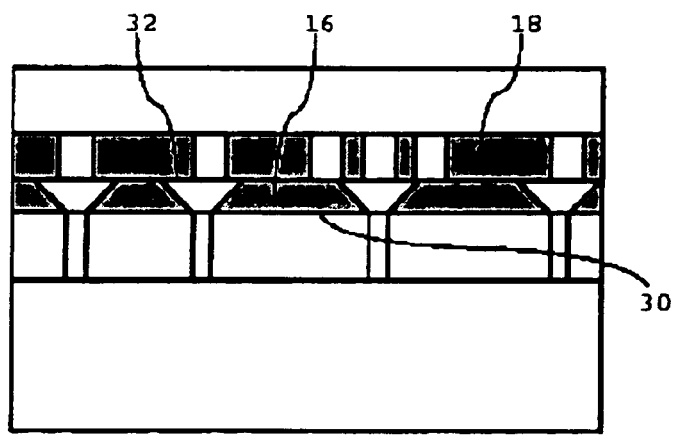
FIG. 4 shows a scanning electron microscope (SEM) image of an actual test sample's pattern that is formed after soft-landing etching using a recipe according to the present invention. The etching is shown as having been stopped on the surface of lightly doped silicon oxide.

FIG. 4 shows a scanning electron microscope image of a sample of a semiconductor device's cross-section after a 100% over-etched is performed. The substrate layer (30) in this case is aluminium, which has been laid with a lightly doped silicon oxide layer (16), and thereupon a highly doped silicon oxide layer (18). The image shows the etching having being stopped at thus forming a contact hole (32).

Preferably, silicon-rich silicon oxide is used for the highly doped oxide layer and fluorinated silicon oxide is used for the lightly doped silicon oxide layer, and that each oxide layer has a reflective index of the range from 1.4 to 1.7 with a most preferred index of least 1.45. The ratio of fluorinated silicon oxide to silicon-rich silicon oxide, or Si—F:Si—O, is below 5.5.

The silicon oxide layers may be doped with boron (B), phosphorus (P), arsenic (As) and silicon (Si), etc. and the doping method may be chosen according to the process set up considerations such as the thickness of each layer to be deposited. Generally, conventional doping methods such as ion implantation, wet doping, deposition, etc. are applicable in this invention. The lightly doped silicon oxide may preferably be chosen from any one of borophosphorus silicate glass (BPSG), phosphorus silicate glass (PSG), USG, NSG.

If other materials are used, the doping level should be controlled according to the requirements of the process and with considerations such as the tolerance of loss of prior layer, etchant specificity to the level of doping, the nature of the device being fabricated and the device's operation.

The thickness of the lightly doped silicon oxide may preferably ranges from 50 to 500 Å and subject to heat treatment at high temperature to obtain higher selectivity. The etching of the highly doped silicon oxide may be performed with a high selectivity to said highly doped silicon oxide to lightly doped silicon oxide controlled at a range from about 2:1 to about 30:1. If the etch rate is controlled at from about 10 to 100 Å/min, the controllability of the etching will be increased.

Depending on the etching selectivity suitable for the semiconductor device's fabrication process, etching may also be performed in more than two etching steps.

For the construction of a structure in depth across layers such as a contact hole where anisotropic etching is required, the present invention's method may be carried out in an appropriate etching chamber e.g. in a gas mixture such as a high-density gas plasma comprising $C_5F_8$ and $O_2$ or a combination of $C_4F_8$, $O_2$ and CO; combinations of 2 or more gases each from (i) $CF_4$, $C_4F_6$, $CH_2F_2$ and (ii) $O_2$, $N_2$, CO, $CHF_3$. Three working examples of etching in gas mixture are provided as follows:

EXAMPLE 1

| Gas plasma: $C_5F_8$ | | |
| --- | --- | --- |
| (a) | Layer etched: | highly doped silicon oxide |
| (b) | $C_5F_8$ flow rate: | 8 to 15 sccm |
| (c) | $O_2$ flow rate: | 8 to 15 sccm |
| (d) | Ar flow rate: | 300 to 500 sccm |
| (e) | Plasma power: | 1000 to 1500 watt |
| (f) | Pressure: | 25 to 45 mT. |

EXAMPLE 2

| Gas plasma: $C_4F_8$ | | |
| --- | --- | --- |
| (a) | Layer etched: | highly doped silicon oxide |
| (b) | $C_4F_8$ flow rate: | 10 to 15 sccm |
| (c) | $O_2$ flow rate: | 3 to 10 sccm |
| (d) | CO flow rate: | 30 to 80 sccm |
| (e) | Ar flow rate: | 150 to 400 sccm. |
| (f) | Plasma power: | 1300 to 1700 watt |
| (g) | Pressure: | 30 to 45 mT |

EXAMPLE 3

| Gas plasma: $C_5F_8$ | | |
| --- | --- | --- |
| (a) | Layer etched: | highly doped silicon oxide |
| (b) | $C_5F_8$ flow rate: | 6 to 8 sccm |
| (c) | $O_2$ flow rate: | 8 to 15 sccm |
| (d) | Ar flow rate: | 300 to 500 sccm. |
| (e) | Plasma power: | 1500 to 1800 watt |
| (f) | Pressure: | 30 to 45 mT. |

The conditions of the gas mixture may be optimised according to the specific requirements of the etching process. Apart from etching performed in a gas plasma chamber, the etching of a uniform contact hole or similar structure may be controlled using U-loading effect to achieve higher selectivity to the sub-layer.

It will be appreciated that the etching recipe may be optimised to obtain suitable selectivity control so that the high selectivity may keep the underlying oxide layer at very good uniformity during the etching process, i.e. causing only low damage parameters during etching lightly doped oxide layer, and increasing the efficiency of the process. This may, for example, be based on the known selectivity of the particular etchant against the materials comprising the two layers to be etched and physical aspects, such as the conductive structures or interconnects.

It will be appreciated that apart from the above example of the two layers of highly doped and lightly doped silicon oxides, it would be obvious to a person skilled in the art that there may be many equivalent or alternative methods in which the difference between the two layers' doping levels or dopants used may be exploited with different suitable etchants to achieve the method or working principle of the present invention. Such equivalents or alternatives are not to be considered as departures from the present invention as illustrated by the examples and specific embodiments described herein and shall be considered as falling within the letter and spirit of the following claims.

What is claimed is:

1. A method of fabricating a semiconductor device comprising the steps of:

(a) laying on a prior layer, a first oxide layer doped in one form;

(b) laying on said first oxide layer, a second oxide layer doped in a different form;

(c) patterning said layers; (d) etching the second layer with an etchant having high selectivity to said second doped oxide layer; and (e) etching the first layer with an etchant having high selectivity to said first doped oxide layer;

wherein the first and second layers' doping are different in concentration;

wherein the first layer is lightly doped and the second layer highly doped; and wherein silicon-rich silicon oxide is used for the highly doped oxide layer and fluorinated silicon oxide is used for the lightly doped silicon oxide layer.

2. A method according to claim 1 wherein the silicon-rich oxide and fluorinated silicon oxide each has a reflective index of the range from 1.4 to 1.7.

3. A method according to claim 1 wherein the reflective index is at least 1.45.

4. A method according to claim 1 wherein the ratio of fluorinated silicon oxide to silicon-rich silicon oxide, or Si—F:Si—O, is below 5.5.

5. A method of fabricating a semiconductor device comprising the steps of:

(a) laying on a prior layer, a first oxide layer doped in one form;

(b) laying on said first oxide layer, a second oxide layer doped in a different form;

(c) patterning said layers;

(d) etching the second layer with an etchant having high selectivity to said second doped oxide layer; and (e) etching the first layer with an etchant having high selectivity to said first doped oxide layer;

wherein the first and second layers' doping are different in concentration;

wherein the first layer is lightly doped and the second layer highly doped; and wherein the first etch step is performed with high selectivity of the highly doped silicon oxide to lightly doped silicon oxide controlled at a range from about 2:1 to about 30:1.

6. A method of fabricating a semiconductor device comprising the steps of:

(a) laying on a prior layer, a first oxide layer doped in one form;

(b) laying on said first oxide layer, a second oxide layer doped in a different form;

(c) patterning said layers;

(d) etching the second layer with an etchant having high selectivity to said second doped oxide layer; and (e) etching the first layer with an etchant having high selectivity to said first doped oxide layer;

wherein the first and second layers' doping are different in concentration;

wherein the first layer is lightly doped and the second layer highly doped; and wherein the second etch step is performed with silicon oxide etching at a rate ranging from about 10 to 100 Å/min.

7. A method of fabricating a semiconductor device comprising the steps of:

(a) laying on a prior layer, a first oxide layer doped in one form;

(b) laying on said first oxide layer, a second oxide layer doped in a different form;

(c) patterning said layers;

(d) etching the second layer with an etchant having high selectivity to said second doped oxide layer; and (e) etching the first layer with an etchant having high selectivity to said first doped oxide layer;

wherein for etching a contact hole, the etching is performed in an appropriate etch process chamber to achieve an anisotropic etch; and wherein the etching is carried out in a gas mixture, including gas plasma, comprising one of the following combinations:

$C_5F_8$ and $O_2$;

$C_4F_8$, $O_2$ and CO.

8. A method according to claim 7 wherein the highly doped silicon oxide is etched using gas mixture comprising $C_5F_8$ at 8 to 15 sccm, $O_2$ at 8 to 15 sccm, plasma power at 1000 to 1500 watt, pressure at 25 to 45 mT, and argon (Ar) at 300 to 500 sccm.

9. A method according to claim 7 wherein the highly doped silicon oxide is etched using gas mixture comprising $C_4F_8$ at 10 to 15 sccm, $O_2$ at 3 to 10 sccm, plasma power at 1300 to 1700 watt, pressure at 30 to 45 mT, CO at 30 to 80 sccm, and Ar at 150 to 400 sccm.

10. A method according to claim 7 wherein the highly doped silicon oxide is etched using gas mixture comprising $C_5F_8$ at 6 to 8 sccm, $O_2$ at 8 to 15, plasma power at 1500 to 1800 watt, pressure at 30 to 45 mT, and Ar at 300 to 500 sccm.

11. A method of fabricating a semiconductor device comprising the steps of:

(a) laying on a prior layer, a first oxide layer doped in one form;

(b) laying on said first oxide layer, a second oxide layer doped in a different form;

(c) patterning said layers;

(d) etching the second layer with an etchant having high selectivity to said second doped oxide layer; and (e) etching the first layer with an etchant having high selectivity to said first doped oxide layer;

wherein for etching a contact hole, the etching is performed in an appropriate etch process chamber to achieve an anisotropic etch; and wherein the contact hole size is controlled using U-loading effect to achieve higher selectivity to the sub-layer.

* * * * *